United States Patent
Hsu et al.

(10) Patent No.: US 10,645,829 B2
(45) Date of Patent: May 5, 2020

(54) ELECTRONIC DEVICE FOR PREVENTING FOREIGN MATTER FROM ENTERING AND ITS DEVICE BASE

(71) Applicant: Quanta Computer Inc., Taoyuan (TW)

(72) Inventors: Shu-Cheng Hsu, Taoyuan (TW); Ku-Wu Lai, Taoyuan (TW); Hsin-I Wu, Taoyuan (TW); Chien-Yu Shih, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 16/202,716

(22) Filed: Nov. 28, 2018

(65) Prior Publication Data

US 2020/0053893 A1 Feb. 13, 2020

(30) Foreign Application Priority Data

Aug. 10, 2018 (TW) ................................ 107211009

(51) Int. Cl.
*H05K 5/02* (2006.01)
*H05K 5/03* (2006.01)

(52) U.S. Cl.
CPC ......... *H05K 5/0234* (2013.01); *H05K 5/0217* (2013.01); *H05K 5/0247* (2013.01); *H05K 5/03* (2013.01)

(58) Field of Classification Search
CPC .. F16M 11/2021; F16M 13/00; G06F 1/1649; G06F 1/1681; H05K 5/0234; H05K 5/0217; H05K 5/0247; H05K 5/03
See application file for complete search history.

(56) References Cited

U.S. PATENT DOCUMENTS

| | | | | |
|---|---|---|---|---|
| 5,335,142 A | * | 8/1994 | Anderson | F16M 11/10 248/183.2 |
| 7,245,481 B2 | * | 7/2007 | Shimizu | F16M 11/046 248/284.1 |
| 8,498,101 B2 | * | 7/2013 | Chiang | F16M 11/105 248/121 |
| 9,119,286 B2 | * | 8/2015 | Liu | H05K 7/00 |
| 2019/0005476 A1 | * | 1/2019 | Luo | G06F 1/16 |

* cited by examiner

*Primary Examiner* — James Wu

(57) ABSTRACT

A device base includes a chassis, a support frame, two shielding members, a crank and a connecting rod. The chassis has an elongated slit and a pivoting seat. The support frame is slidably disposed within the elongated slit between the shielding members, and pivotally connected to the pivoting seat. One of the shield members is fixed to the support frame. The connecting rod is pivotally connected to the crank and the other shielding member. The crank is fixed to the support frame. The elongated slit is completely shielded by the support frame and at least one of the first shielding member and the second shielding member, collectively.

10 Claims, 6 Drawing Sheets

ELECTRONIC DEVICE FOR PREVENTING FOREIGN MATTER FROM ENTERING AND ITS DEVICE BASE

RELATED APPLICATIONS

This application claims priority to Taiwan Application Serial Number 107211009, filed Aug. 10, 2018, which is herein incorporated by reference.

BACKGROUND

Field of Disclosure

The disclosure relates to a device base. More particularly, the disclosure relates to a device base of an electronic device.

Description of Related Art

As technology continues to develop, electronics product with a touch-sensitive human-machine interface, such as those of a point of sale (POS), are widely used in the sales or service industries to provide order, sales, and inventory information immediately.

The forgoing electronic product is generally provided with a rotatable display screen for providing more viewing directions to users. However, when a user adjusts the rotation of the rotatable display screen of the electronic product to meet the different viewing-direction requirements of the user, dust particles or foreign objects (such as screws or coins) may be disturbed to fall into the internal structure of the electronic product, thereby causing damage to the internal structure or circuits.

Therefore, ways to provide a solution to effectively solve the aforementioned inconvenience and shortages shall be seriously concerned by the related industries immediately.

SUMMARY

In one embodiment of the disclosure, a device base is provided. The device base includes a chassis, a pivot shaft, a support frame, a first shielding member, a second shielding member, a crank and a connecting rod. The chassis includes a housing having an elongated slit, and a pivoting seat disposed in the housing. The pivot shaft is disposed in the housing. The support frame is slidably disposed within the elongated slit, and pivotally connected to the pivoting seat through the pivot shaft. The first shielding member is disposed on one side of the support frame, and fixedly connected to the support frame. The second shielding member is disposed on the other side of the support frame. The crank is fixedly connected to the support frame. The connecting rod is pivotally connected to the crank and the second shielding member. The elongated slit is completely shielded by the support frame and at least one of the first shielding member and the second shielding member, collectively.

Thus, no matter how the user adjusts the rotation of the support frame relative to the housing, through the construction of the embodiment above, dust particles or foreign objects (such as screws or coins) can be prevented from falling into the housing, thereby will not cause damage to the internal structure or circuits.

According to one or more embodiments of the disclosure, in the device base, the support frame includes a pivotal member, a device-jointing member and a connecting member. The pivotal member is disposed in the housing, and pivotally connected to the pivoting seat. The device-jointing member is located out of the housing. The connecting member is connected to the pivotal member and the device-jointing member, and extends outwards from the chassis through the elongated slit.

According to one or more embodiments of the disclosure, in the device base, the support frame is provided with a wire-receiving slot, and the wire-receiving slot is collectively formed on the device-jointing member and the connecting member.

According to one or more embodiments of the disclosure, in the device base, the connecting member includes an arched rib and a neck rib, the arched rib is connected to the neck rib and the device-jointing member. When the elongated slit is completely shielded by the support frame and the first shielding member collectively, the arched rib is disposed within the housing; when the elongated slit is completely shielded by the support frame and the second shielding member collectively, the arched rib is disposed on an outer surface of the housing.

According to one or more embodiments of the disclosure, in the device base, the housing is provided with a first surface, a second surface and a curved portion. The first surface and the second surface are not coplanar. The curved portion is disposed between the first surface and the second surface. The elongated slit is formed on the first surface of the housing. When the elongated slit is completely shielded by the support frame and the second shielding member collectively, the arched rib is disposed on the curved portion and the second surface of the housing.

According to one or more embodiments of the disclosure, in the device base, the first shielding member is fixedly connected to the neck rib and the pivotal member, and one surface of the first shielding member opposite to the pivotal member is a curved surface, and the curved surface is used to cover the remaining part of the elongated slit other than the part that the support frame is disposed within the elongated slit.

According to one or more embodiments of the disclosure, in the device base, the second shielding member includes a top area and a bottom area which are opposite to each other, the top area is used to cover the remaining part of the elongated slit other than the part that the support frame is disposed within the elongated slit, the bottom area is provided with a pivoting unit, the pivoting unit is used to pivotally connect to one end of the connecting rod.

According to one or more embodiments of the disclosure, in the device base, the housing further includes a sliding slot facing towards the elongated slit. The second shielding member is linearly and slidably received within the sliding slot.

In one embodiment of the disclosure, an electronic device is provided. The electronic device includes a device base as described above, and an electronic part disposed on one side of the housing, and fixedly connected to one end of the support frame of the device base opposite to the pivoting seat.

According to one or more embodiments of the disclosure, in the electronic device, the electronic part includes at least one wire, and one side surface of the support frame is formed with a wire-receiving slot, and the wire is received within the wire-receiving slot, and the wire extends into the housing via the support frame.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
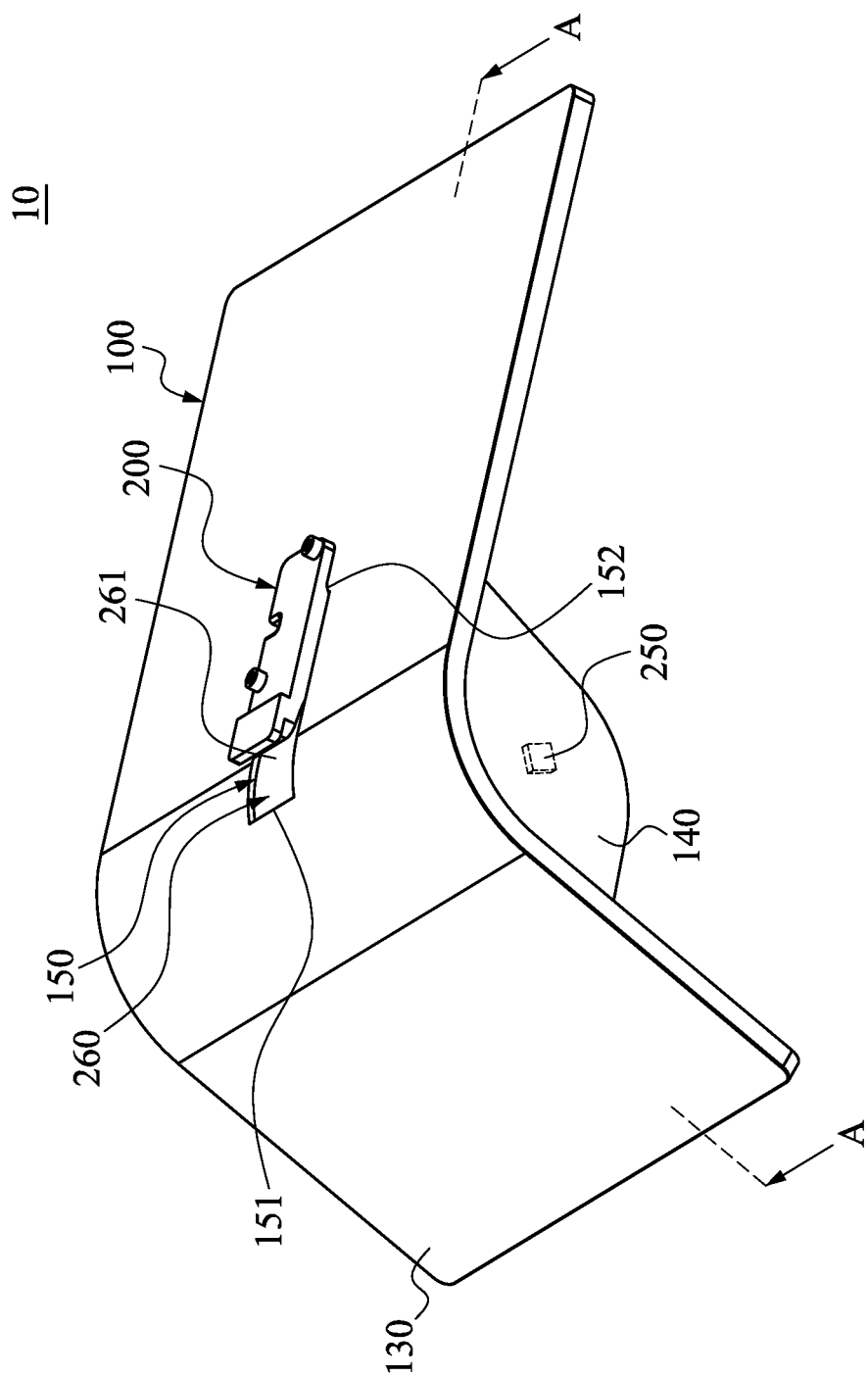
FIG. 1 is a perspective view of a device base according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
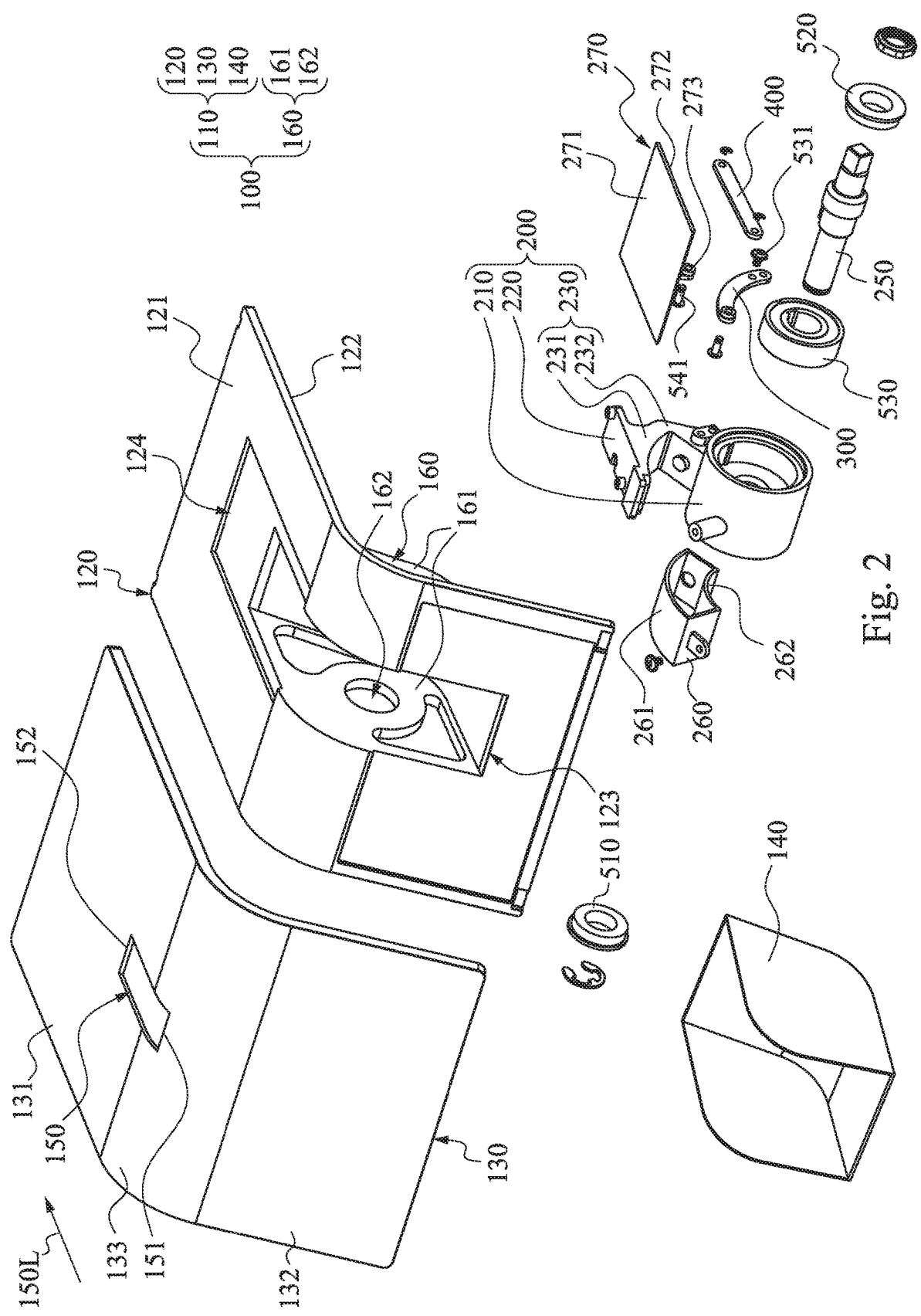
FIG. 2 is a disassembled view of the device base of FIG. 1.
Figure 3:
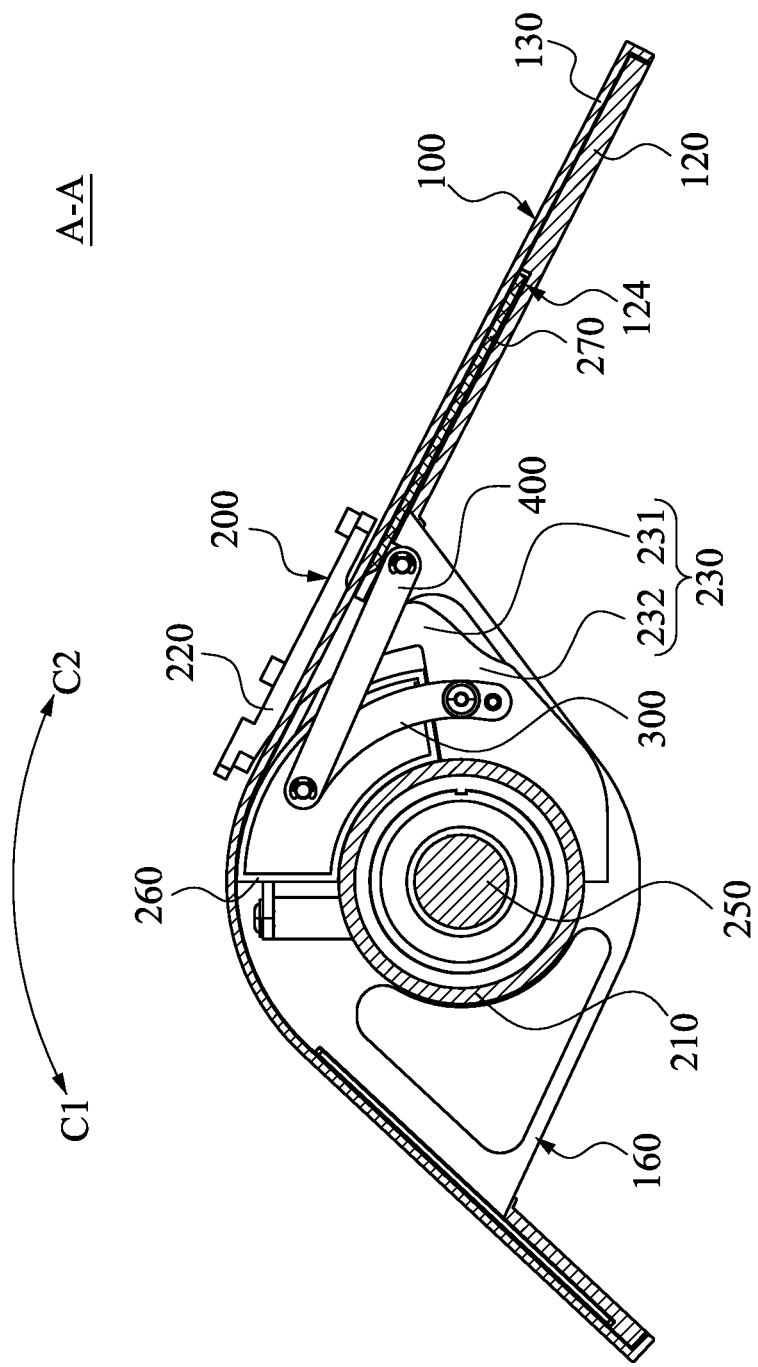
FIG. 3 is a cross sectional view of FIG. 1 viewed along a line A-A.

Reference is now made to FIG. 1 to FIG. 3, in which FIG. 1 is a perspective view of a device base 10 according to one embodiment of the disclosure, FIG. 2 is a disassembled view of the device base 10 of FIG. 1, and FIG. 3 is a cross sectional view of FIG. 1 viewed along a line A-A. As shown in FIG. 1 to FIG. 3, in the embodiment, the device base 10 includes a chassis 100, a support frame 200, a pivot shaft 250, a first shielding member 260, a second shielding member 270, a crank 300 and a connecting rod 400. The chassis 100 includes a housing 110 and a pivoting seat 160. The housing 110 includes an elongated slit 150 having a first end 151 and a second end 152. The first end 151 and a second end 152 respectively are located at two opposite ends of the elongated slit 150 extending in a longitudinal direction 150L. The pivoting seat 160 is disposed in the housing 110. The pivot shaft 250 is disposed in the housing 110. The support frame 200 is slidably disposed within the elongated slit 150, and pivotally connected to the pivoting seat 160 through the pivot shaft 250, thus, the support frame 200 can be rotated relative to the chassis 100. The support frame 200 is arranged between the first shielding member 260 and the second shielding member 270. The first shielding member 260 is disposed on one side of the support frame 200, and fixedly connected to the support frame 200. The second shielding member 270 is disposed on the other side of the support frame 200. The crank 300 is fixedly connected to the support frame 200. The connecting rod 400 is pivotally connected to the crank 300 and the second shielding member 270. For example, the crank 300 is formed in a curved shape, and the connecting rod 400 is formed in a linear shape. One end of the crank 300 is fixedly connected to the support frame 200 through a fixing bolt 531, the other end of the crank 300 is pivotally connected to one end of the connecting rod 400, and the other end of the connecting rod 400 is pivotally connected to the second shielding member 270 through a screw 541.

Thus, when the support frame 200 is rotated relative to the chassis 100 towards a second direction C2 so as to reach the second end 152 of the elongated slit 150 within the elongated slit 150, the first shielding member 260 is collectively moved with the support frame 200 so that the elongated slit 150 can be completely shielded by the support frame 200 and the first shielding member 260, collectively. In other words, after the first shielding member 260 slides to a position under the elongated slit 150 in the housing 110, the remaining part of the elongated slit 150 other than the part that the support frame 200 disposed within the elongated slit 150 is shielded.

Figure 4:
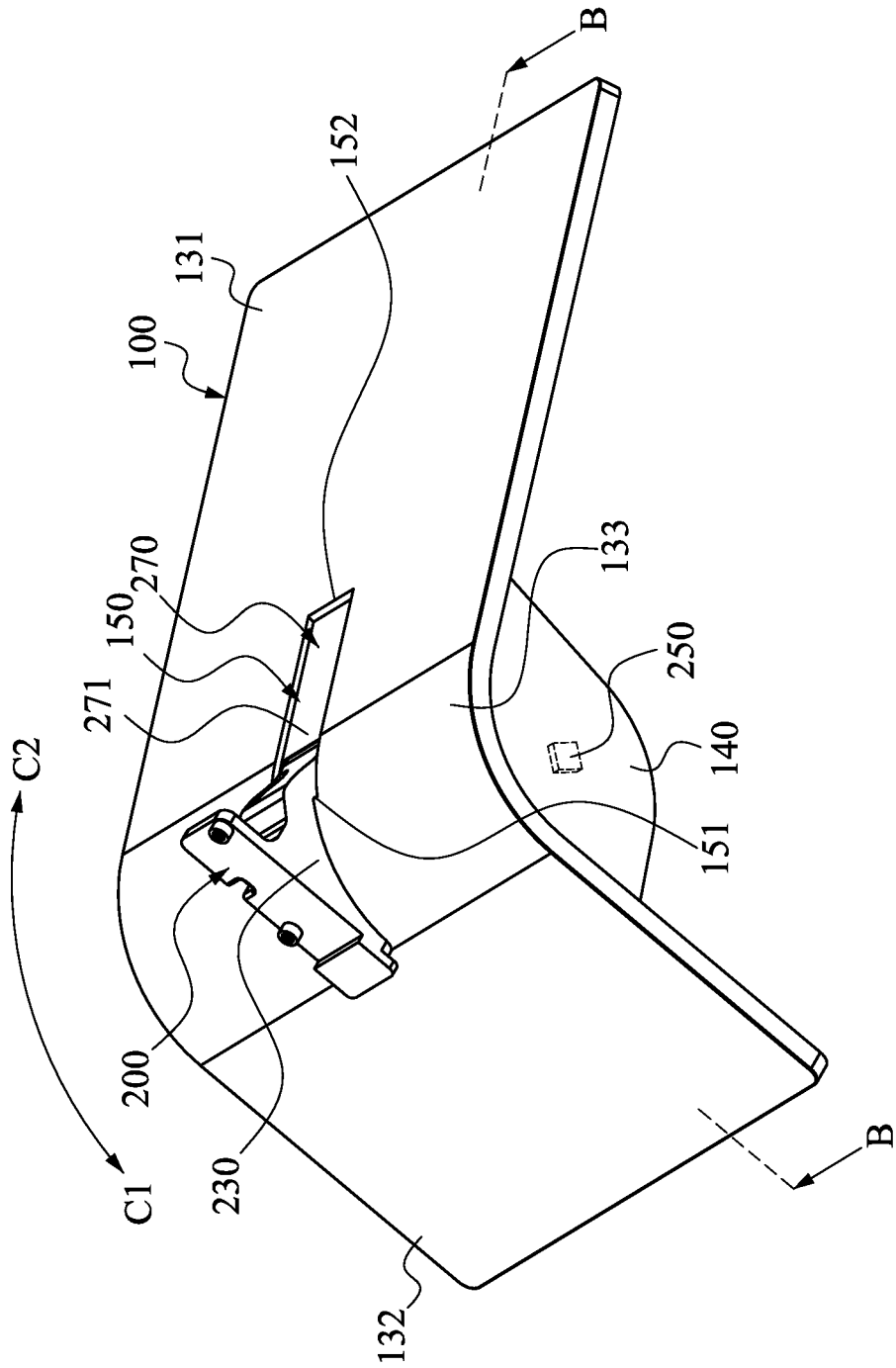
FIG. 4 is an operational schematic view of the device base of FIG. 1.
Figure 5:
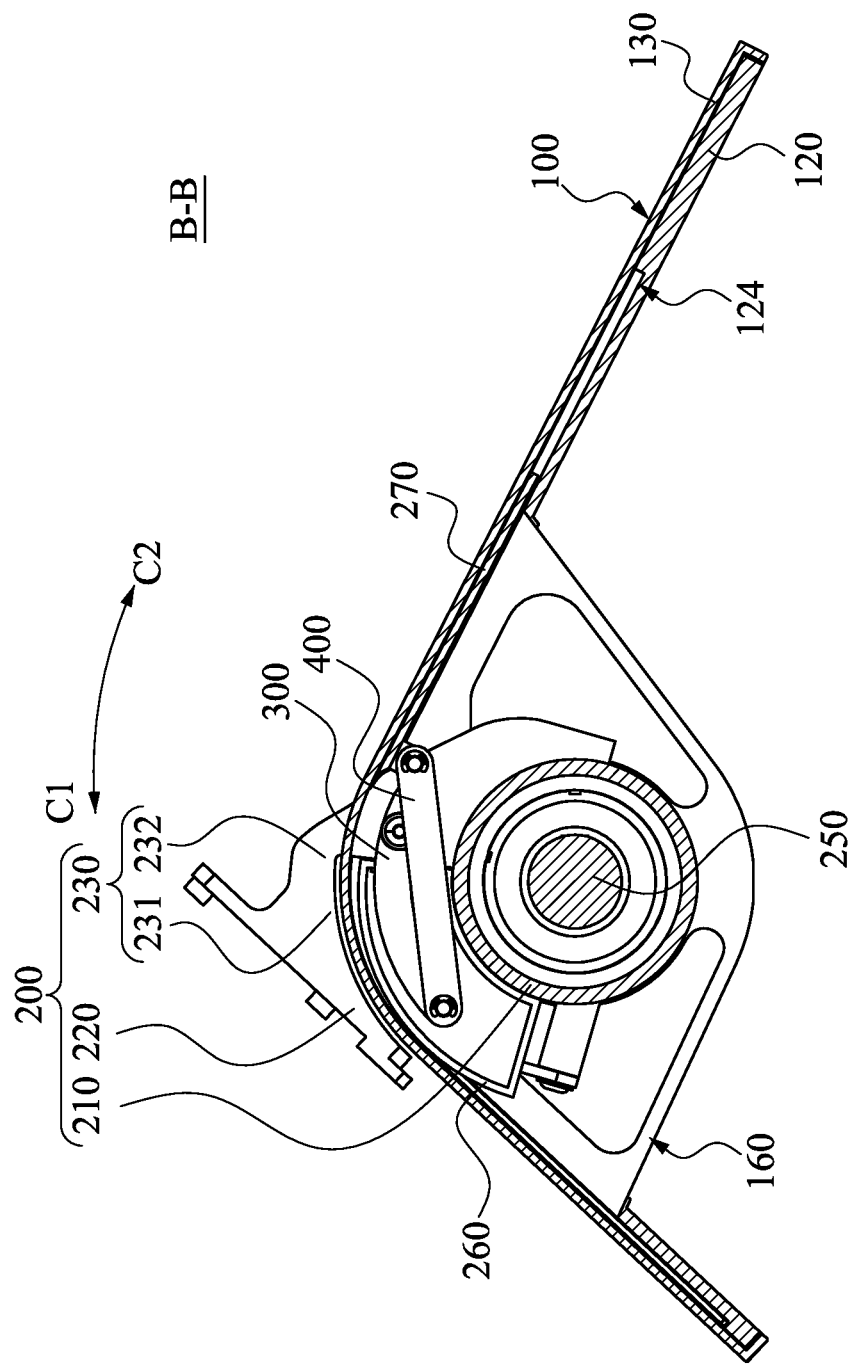
FIG. 5 is a cross sectional view of FIG. 4 viewed along a line B-B.

FIG. 4 is an operational schematic view of the device base of FIG. 1. FIG. 5 is a cross sectional view of FIG. 4 viewed along a line B-B. As shown in FIG. 4 and FIG. 5, in the embodiment, when the support frame 200 is rotated relative to the chassis 100 towards a first direction C1 so as to reach the first end 151 of the elongated slit 150 within the elongated slit 150, the second shielding member 270 is collectively moved with the crank 300 and the connecting rod 400 so that the elongated slit 150 can be completely shielded by the support frame 200 and the second shielding member 270, collectively. In other words, after the second shielding member 270 slides to a position under the elongated slit 150 in the housing 110, the remaining part of the elongated slit 150 other than the part that the support frame 200 disposed within the elongated slit 150 is shielded. Furthermore, when the support frame 200 is rotated to reach the first end 151 of the elongated slit 150 within the elongated slit 150, the first shielding member 260 is collectively moved with the support frame 200 to be moved away from the position of the elongated slit 150 where the first shielding member 260 originally covers.

Hence, as shown in FIG. 3, when the support frame 200 is rotated to reach the second end 152 of the elongated slit 150, since the first shielding member 260 also is collectively moved with the crank 300 and the connecting rod 400, the second shielding member 270 is collectively moved with the connecting rod 400 to be moved away from the position of the elongated slit 150 where the second shielding member 270 originally covers.

It is to be understood, when the support frame 200 is rotated to a middle of the elongated slit 150 within the elongated slit 150 (not shown), the elongated slit 150 can be completely shielded by a part of the first shielding member 260, the support frame 200 disposed within the elongated slit 150 and a part of the second shielding member 270, collectively.

Thus, no matter how a user adjusts the rotation of the support frame relative to the housing, through the construction of the embodiment above, since the elongated slit can be completely shielded by the support frame 200 and one of the first shielding member 260 and the second shielding member 270, collectively, dust particles or foreign objects (such as screws or coins) can be prevented from falling into the housing of the device base 10, thereby will not cause damage to the internal structure or circuits thereof.

In the embodiment, specifically, the housing 110 includes a main member 120, an outer cover 130 and a cover 140. The main member 120 is provided with a top surface 121, a bottom surface 122 and a through opening 123. The top surface 121 and the bottom surface 122 are opposite to each other. The through opening 123 penetrates through the main member 120 to connect the top surface 121 and the bottom surface 122. The pivoting seat 160 is provided with two lugs 161. The two lugs 161 are protrudingly disposed on the bottom surface 122 of the main member 120, and located at opposite sides of the through opening 123. The lugs 161 respectively have pivot holes 162 that are coaxial with each other. The cover 140 is assembled to the bottom surface 122 of the main member 120 so as to cover the lugs 161 to receive the lugs 161 therein. The outer cover 130 covers the top surface 121 of the main member 120. The elongated slit 150 is formed on the outer cover 130. More particularly, one side of the outer cover 130 includes a first surface 131, a second surface 132 and a curved portion 133. The first surface 131 and the second surface 132 are not coplanar, and the curved portion 133 is disposed between the first surface 131 and the second surface 132, and the elongated slit 150 is formed on the first surface 131. In a specified embodiment, the elongated slit 150 is formed on the curved portion 133.

Furthermore, one end of the support frame 200 is disposed between the lugs 161, and the other end of the support frame 200 is disposed on the outer cover 130 of the housing 110 through the through opening 123 and the elongated slit 150. More specifically, the support frame 200 includes a pivotal member 210, a device-jointing member 220 and a connecting member 230. The pivotal member 210 is disposed in the housing 110, and pivotally connected to the pivoting seat 160. More specifically, the pivotal member 210 is disposed in the cover 140 between the lugs 161. The pivotal member 210 can be pivotally connected to the pivoting seat 160 with the pivot shaft 250 inserting through the pivotal member 210 and the pivot holes 162. The device-jointing member 220 is located out of the housing 110. The connecting member 230 is connected to the pivotal member 210 and the device-jointing member 220, and extends outwards from the chassis 100 through the through opening 123 and the elongated slit 150. As shown in FIG. 3, when the elongated slit 150 is completely shielded by the support frame 200 and the first shielding member 260, collectively, both of the pivotal member 210 and the connecting member 230 are completely disposed within the housing 110. For example, the device-jointing member 220 is disposed within one part of the elongated slit 150, and the first shielding member 260 covers the other part of the elongated slit 150 in the housing 110.

On the contrary, as shown in FIG. 5, when the elongated slit 150 is completely shielded by the support frame 200 and the second shielding member 270, collectively, the connecting member 230 is partially disposed in the housing 110. For example, the connecting member 230 is disposed in one part of the elongated slit 150, and the second shielding member 270 covers the other part of the elongated slit 150 in the housing 110.

More specifically, as shown in FIG. 2 and FIG. 3, the connecting member 230 includes an arched rib 231 and a neck rib 232. The arched rib 231 is directly connected to the neck rib 232 and the device-jointing member 220, and the neck rib 232 is directly connected to the arched rib 231 and the pivotal member 210. Thus, as shown in FIG. 3, when the elongated slit 150 is completely shielded by the support frame 200 and the first shielding member 260, collectively, the arched rib 231 and the neck rib 232 of the connecting member 230 are disposed within the housing 110.

On the contrary, as shown in FIG. 5, when the elongated slit 150 is completely shielded by the support frame 200 and the second shielding member 270, collectively, the arched rib 231 is disposed on an outer surface of the housing 110.

More specifically, at this moment, since the arched rib 231 transversally extends away from the elongated slit 150, the arched rib 231 covers the second surface 132 of the outer cover 130 and the curved portion 133.

As shown in FIG. 2 and FIG. 3, the first shielding member 260 is fixedly connected to the neck rib 232 and the pivotal member 210. More specifically, two opposite ends of the first shielding member 260 are fixedly connected to the neck rib 232 and the pivotal member 210, respectively, so that the first shielding member 260 is more stably located on the support frame 200. One surface of the first shielding member 260 opposite to the pivotal member 210 is a first curved surface 261. When the support frame 200 is rotated to reach the second end 152 of the elongated slit 150, the first shielding member 260 is collectively moved with the support frame 200 so that the first curved surface 261 of the first shielding member 260 can slide to the position under the elongated slit 150 in the housing 110. Thus, the remaining part of the elongated slit 150 other than the part that the support frame 200 disposed within the elongated slit 150 can be shielded. For example, the first shielding member 260 is, for example, a fan-shaped body disposed on the surface of the pivotal member 210. One surface of the first shielding member 260 facing towards the pivotal members 210 is provided with a second curved surface 262. The second curved surface 262 cooperatively matches the surface of the pivotal member 210 so as to be conformably disposed on the surface of the pivotal member 210. However, the disclosure is not limited to the first shielding member 260.

Also, the second shielding member 270 includes a top area 271 and a bottom area 272 which are opposite to each other. The top area 271 is used to cover the remaining part of the elongated slit 150 other than the part that the support frame 200 is disposed within the elongated slit 150. The bottom area 272 is provided with a pivoting unit 273. The pivoting unit 273 is used to pivotally connect to the other end of the connecting rod 400. For example, the second shielding member 270 is a plate body, however, the disclosure is not limited to the shape of the second shielding member 270. Moreover, the housing 110 further includes a sliding slot 124. The sliding slot 124 is arranged to face towards the elongated slit 150 so that the second shielding member 270 is linearly and slidably received within the sliding slot 124. In the embodiment, the sliding slot 124 is formed on the top surface 121 of the main member 120. Thus, when the support frame 200 is rotated to push the second shielding member 270, the second shielding member 270 is linearly moved away from the position of the elongated slit 150 where the second shielding member 270 originally covers.

Furthermore, referring to FIG. 2, the device base 10 further includes a left bearing 510, a right bearing 520 and an intermediate bearing 530. The intermediate bearing 530 is located between the left bearing 510 and the right bearing 520 within the pivotal member 210. The pivot shaft 250 coaxially passes through the left bearing 510, the right bearing 520, and the intermediate bearing 530 so as to more smoothly facilitate the rotation of the support frame 200.

Figure 6:
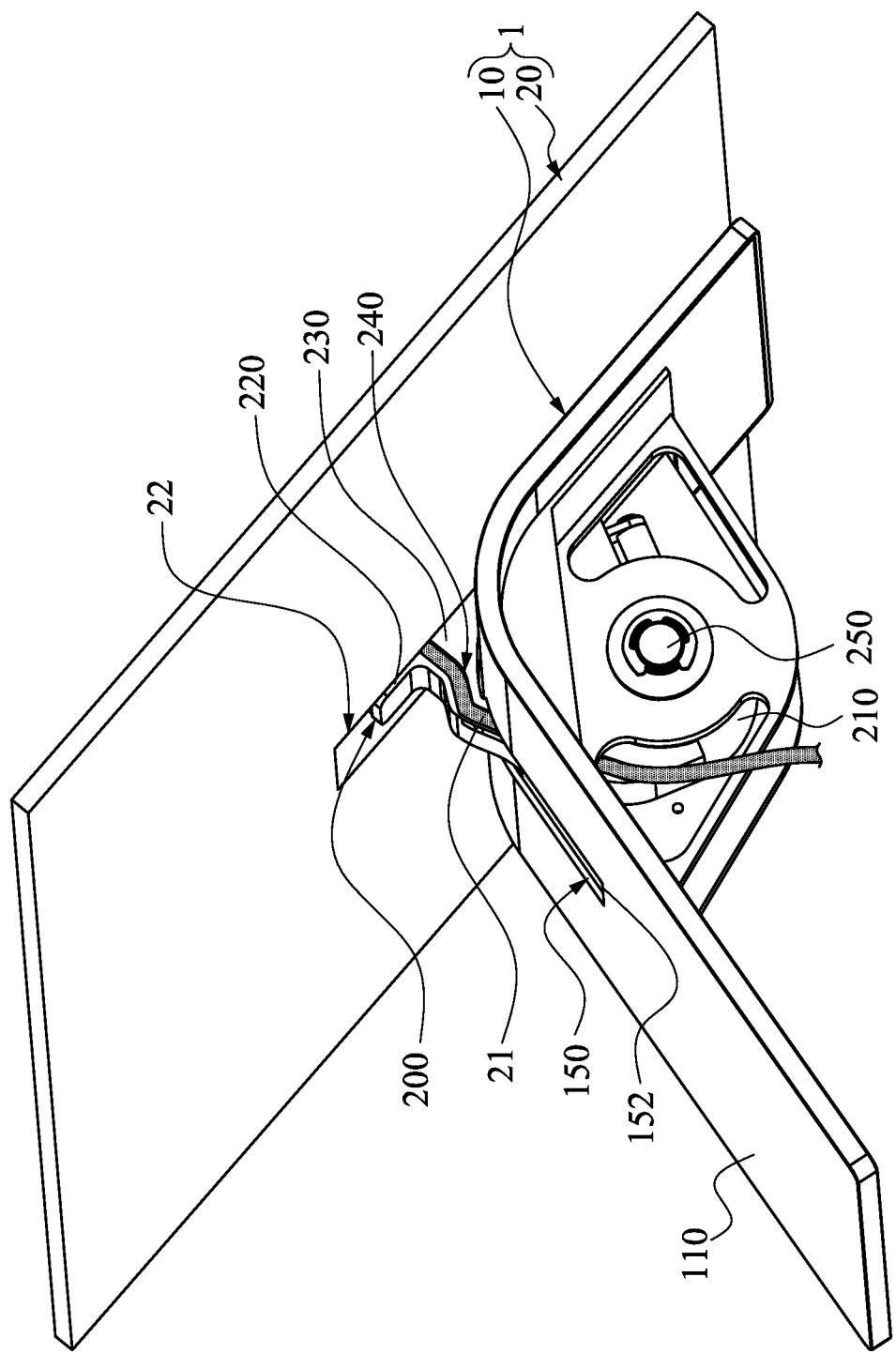
FIG. 6 is an assembled view of an electronic device according to one embodiment of the disclosure.

FIG. 6 is an assembled view of an electronic device according to one embodiment of the disclosure. As shown in FIG. 6, the electronic device 1 includes an electronic part 20 and a device base 10 as described above. The electronic part 20 is assembled to the support frame 200 of the device base 10. For example, the device-jointing member 220 of the support frame 200 extends into a recess 22 of the electronic part 20, and is fixedly connected to the electronic part 20 within the recess 22. Thus, the electronic part 20 can be rotated relative to the device base 10 through the support frame 200.

As shown in FIG. 6, the support frame 200 includes a wire-receiving slot 240. The wire-receiving slot 240 is formed with one side surface of the support frame 200, and is collectively located at the connecting member 230 and the device-jointing member 220. The electronic part 20 includes at least one wire 21. The wire 21 of the electronic part 20 extends into the housing 110 via the support frame 200, and the wire 21 is received within the wire-receiving slot 240. Since the wire 21 is not exposed outwards from the electronic device 1, the wire 21 can be prevented from causing messy appearance, and the electronic device 1 will not be damaged due to pulling the wire 21.

It is noted, the aforementioned electronic part 20 is a point of sale (POS), for example, however, the disclosure is not limited thereto. In other embodiments, the electronic part may also be a global positioning system (GPS), a personal digital assistant (PDA), a cellular phone or a tablet PC, etc.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A device base, comprising:
   a chassis comprising a housing having an elongated slit, and a pivoting seat disposed in the housing;
   a pivot shaft disposed in the housing;
   a support frame slidably disposed within the elongated slit, and pivotally connected to the pivoting seat through the pivot shaft;
   a first shielding member disposed on one side of the support frame, and fixedly connected to the support frame;
   a second shielding member disposed on the other side of the support frame;
   a crank fixedly connected to the support frame; and
   a connecting rod pivotally connected to the crank and the second shielding member, wherein the elongated slit is completely shielded by the support frame and at least one of the first shielding member and the second shielding member, collectively.

2. The device base of claim 1, wherein the support frame comprises:
   a pivotal member disposed in the housing, and pivotally connected to the pivoting seat;
   a device-jointing member located out of the housing; and
   a connecting member connected to the pivotal member and the device-jointing member, and extending outwards from the chassis through the elongated slit.

3. The device base of claim 2, wherein the support frame is provided with a wire-receiving slot, and the wire-receiving slot is collectively formed on the device-jointing member and the connecting member.

4. The device base of claim 3, wherein the second shielding member comprises a top area and a bottom area which are opposite to each other, the top area is used to cover the remaining part of the elongated slit other than the part that the support frame disposed within the elongated slit, the bottom area is provided with a pivoting unit, the pivoting unit is used to pivotally connect to one end of the connecting rod.

5. The device base of claim 2, wherein the connecting member comprises an arched rib and a neck rib, the arched rib is connected to the neck rib and the device-jointing member, wherein, when the elongated slit is completely shielded by the support frame and the first shielding member collectively, the arched rib is disposed within the housing; when the elongated slit is completely shielded by the support frame and the second shielding member collectively, the arched rib is disposed on an outer surface of the housing.

6. The device base of claim 5, wherein the housing is provided with a first surface, a second surface and a curved portion, the first surface and the second surface are not coplanar, the curved portion is disposed between the first surface and the second surface, and the elongated slit is formed on the first surface of the housing,
   wherein, when the elongated slit is completely shielded by the support frame and the second shielding member collectively, the arched rib is disposed on the curved portion and the second surface of the housing.

7. The device base of claim 5, wherein the first shielding member is fixedly connected to the neck rib and the pivotal member, and one surface of the first shielding member opposite to the pivotal member is a curved surface, and the curved surface is used to cover the remaining part of the elongated slit other than the part that the support frame disposed within the elongated slit.

8. The device base of claim 1, wherein the housing further comprises a sliding slot facing towards the elongated slit, wherein the second shielding member is linearly and slidably received within the sliding slot.

9. An electronic device comprising:
   the device base of claim 1; and
   an electronic part disposed on one side of the housing, and fixedly connected to one end of the support frame of the device base opposite to the pivoting seat.

10. The electronic device of claim 9, wherein the electronic part comprises at least one wire, and one side surface of the support frame is formed with a wire-receiving slot, and the wire is received within the wire-receiving slot, and the wire extends into the housing via the support frame.

* * * * *